(12) United States Patent
Chen

(10) Patent No.: US 7,044,800 B2
(45) Date of Patent: May 16, 2006

(54) DUAL PURPOSE MEMORY CARD ADAPTER

(75) Inventor: Yuan-Hua Chen, Taoyuan Hsien (TW)

(73) Assignee: Kingconn Technology Co., Ltd., Taoyuan Hsien (TW)

( * ) Notice: Subject to any disclaimer, the term of this patent is extended or adjusted under 35 U.S.C. 154(b) by 0 days.

(21) Appl. No.: 11/088,731

(22) Filed: Mar. 25, 2005

(65) Prior Publication Data

US 2006/0009079 A1   Jan. 12, 2006

(30) Foreign Application Priority Data

Jul. 7, 2004   (TW) .............................. 93210714 U

(51) Int. Cl.
*H01R 24/00* (2006.01)

(52) U.S. Cl. ................................... 439/630

(58) Field of Classification Search ................ 439/630, 439/945–947, 92, 95, 97, 939, 326, 76.1, 439/79, 636; 361/735, 737, 753, 816
See application file for complete search history.

(56) References Cited

U.S. PATENT DOCUMENTS

| | | | | |
|---|---|---|---|---|
| 5,470,237 | A | * | 11/1995 | Byczek et al. ............. 439/76.1 |
| 6,773,275 | B1 | * | 8/2004 | Chen ........................... 439/92 |
| 6,821,155 | B1 | * | 11/2004 | Hsieh ........................ 439/630 |
| 2003/0133270 | A1 | * | 7/2003 | Liu et al. .................... 361/728 |
| 2005/0106920 | A1 | * | 5/2005 | Shih .......................... 439/326 |

* cited by examiner

*Primary Examiner*—J. F. Duverne
(74) *Attorney, Agent, or Firm*—Rosenberg, Klein & Lee

(57) ABSTRACT

A dual purpose memory card adapter comprising a base and a cover. The base is configured as a female connector with a plurality of positioning fingers corresponding to conducting pieces of MS (Memory Stick) and MS Duo cards. The positioning fingers are uniformly spaced within the memory card adapter. Accordingly, the memory card adapter can be shared by MS and MS Duo cards. Besides, the positioning fingers prevent the MS and MS Duo cards from a false insertion into the memory card adapter in a reverse direction.

2 Claims, 3 Drawing Sheets

DUAL PURPOSE MEMORY CARD ADAPTER

BACKGROUND OF THE INVENTION

1. Field of the Invention

The invention relates to a dual purpose memory card adapter, and more particularly, to an adapter for Memory Stick (MS) and Memory Stick (MS) Duo.

2. Description of the Related Art

Nowadays, a memory card adapter shared by the Memory Stick (MS) and Memory Stick (MS) is still unavailable in the market. Both MS and MS Duo cards have a male connector with conducting pieces recessed on the surface of the cards. The MS card has a greater thickness than the MS Duo so that the conducting pieces of MS card are recessed to a greater extent than that of MS Duo card. In this way, the clearance of the conducting pieces of both cards to their other surface is substantially identical.

SUMMARY OF THE INVENTION

It is a primary object of the invention to provide a dual purpose memory card adapter that can be shared by MS and MS Duo cards.

It is another object of the invention to provide a dual purpose memory card adapter that can prevent MS and MS Duo cards from a false insertion into the memory card adapter in a reverse direction.

In order to achieve the above-mentioned objects, a memory card adapter comprises a base and a cover. The base is configured as a female connector with a plurality of positioning fingers corresponding to conducting pieces of MS (Memory Stick) and MS Duo cards. The positioning fingers are uniformly spaced within the memory card adapter.

BRIEF DESCRIPTION OF THE DRAWINGS

The accomplishment of this and other objects of the invention will become apparent from the following descriptions and its accompanying drawings of which.

DETAILED DESCRIPTION OF THE PREFERRED EMBODIMENT

Figure 1:
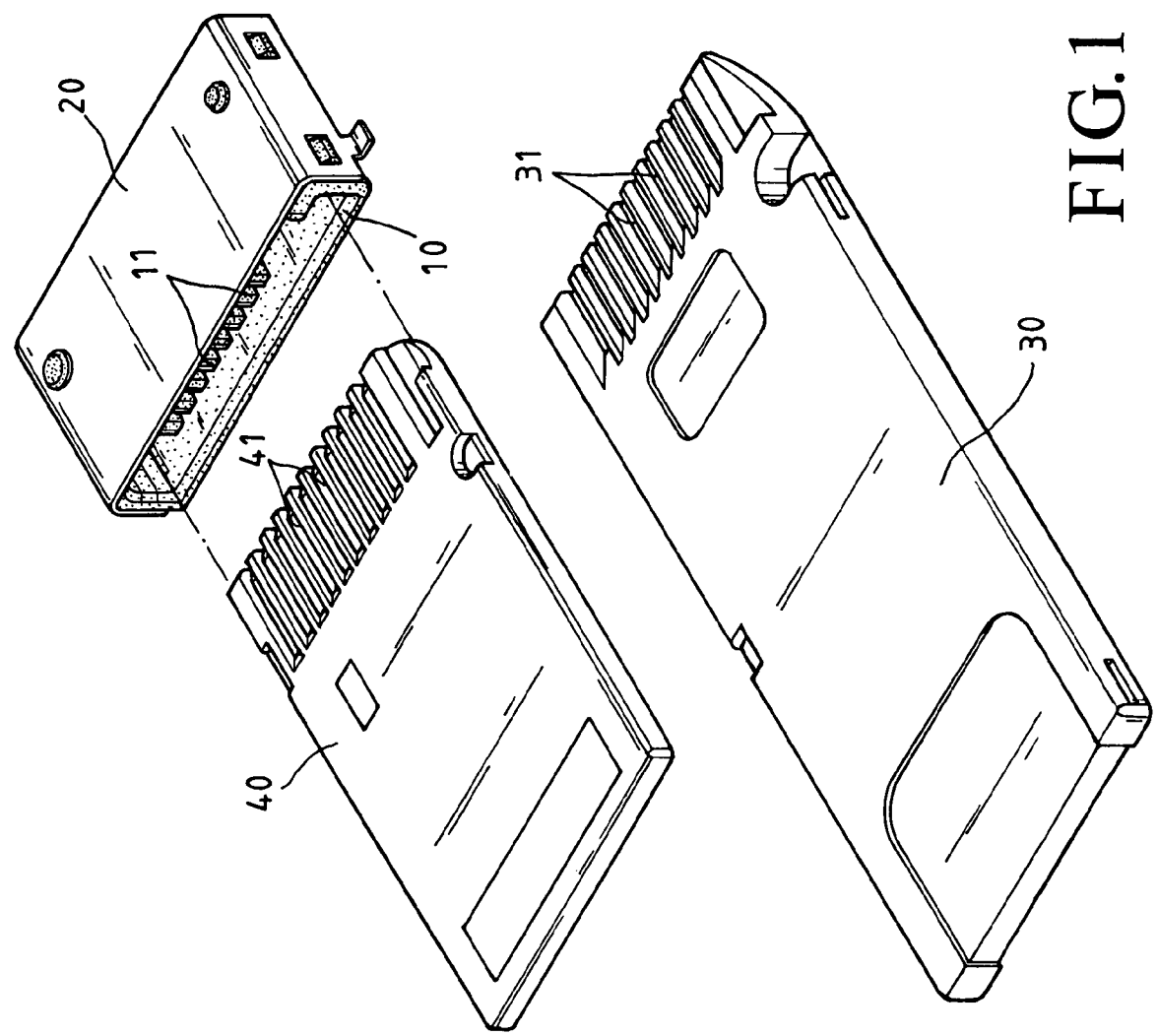
FIG. 1 is a perspective exploded view of a memory card adapter of the invention that can be shared by MS and MS Duo cards.

First of all, referring to FIG. 1, a dual purpose memory card adapter in accordance with the invention consists of a base 10 and a cover 20. The base 10 is configured as a female connector with a plurality of positioning fingers 11 corresponding to conducting pieces 31, 41 of the male connector of MS and MS Duo cards 30, 40.

Figure 2:
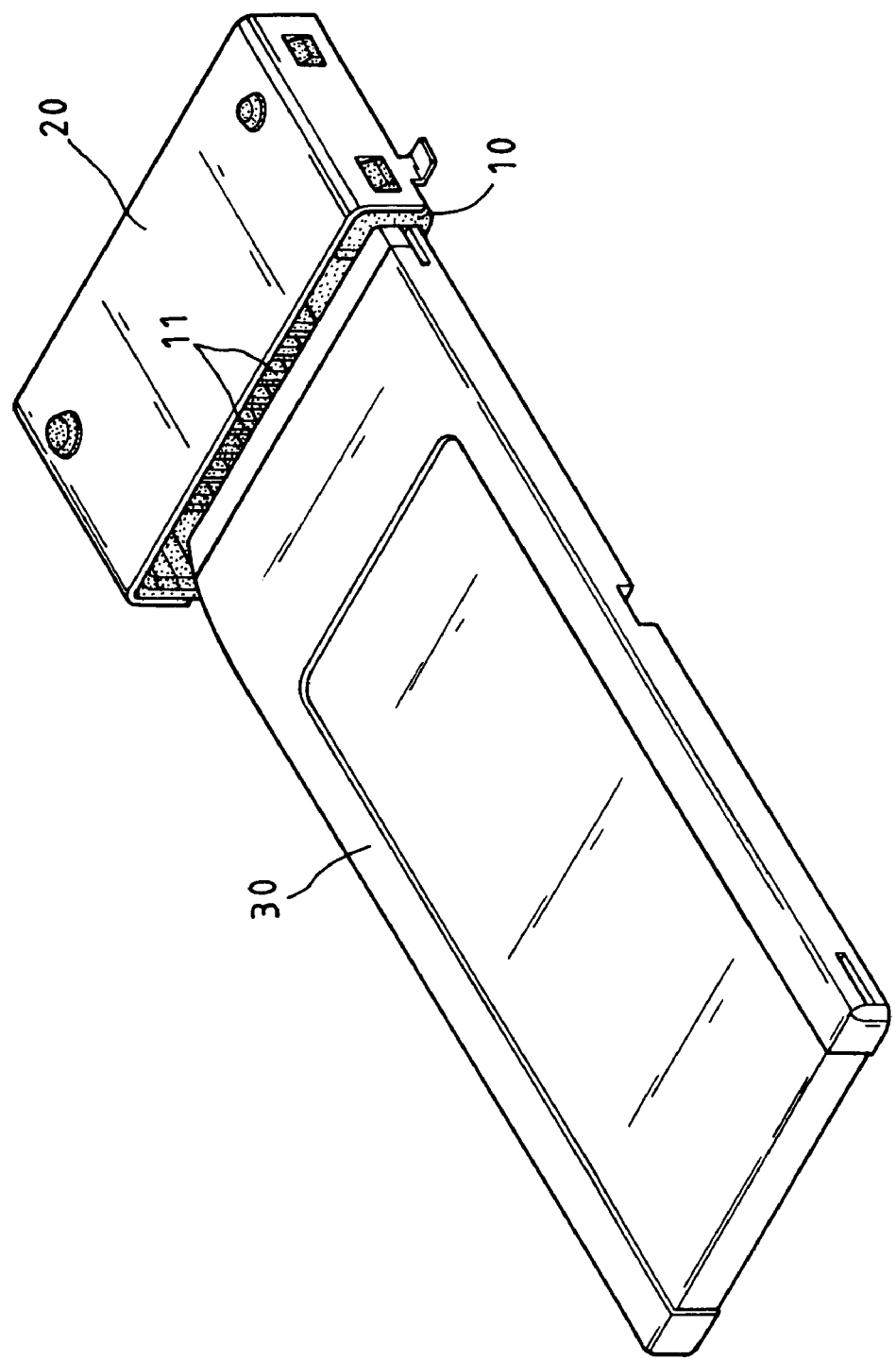
FIG. 2 is a perspective view of the memory card adapter of the invention, showing the prevention of the MS card from a false insertion into the memory card adapter in a reverse direction.
Figure 3:
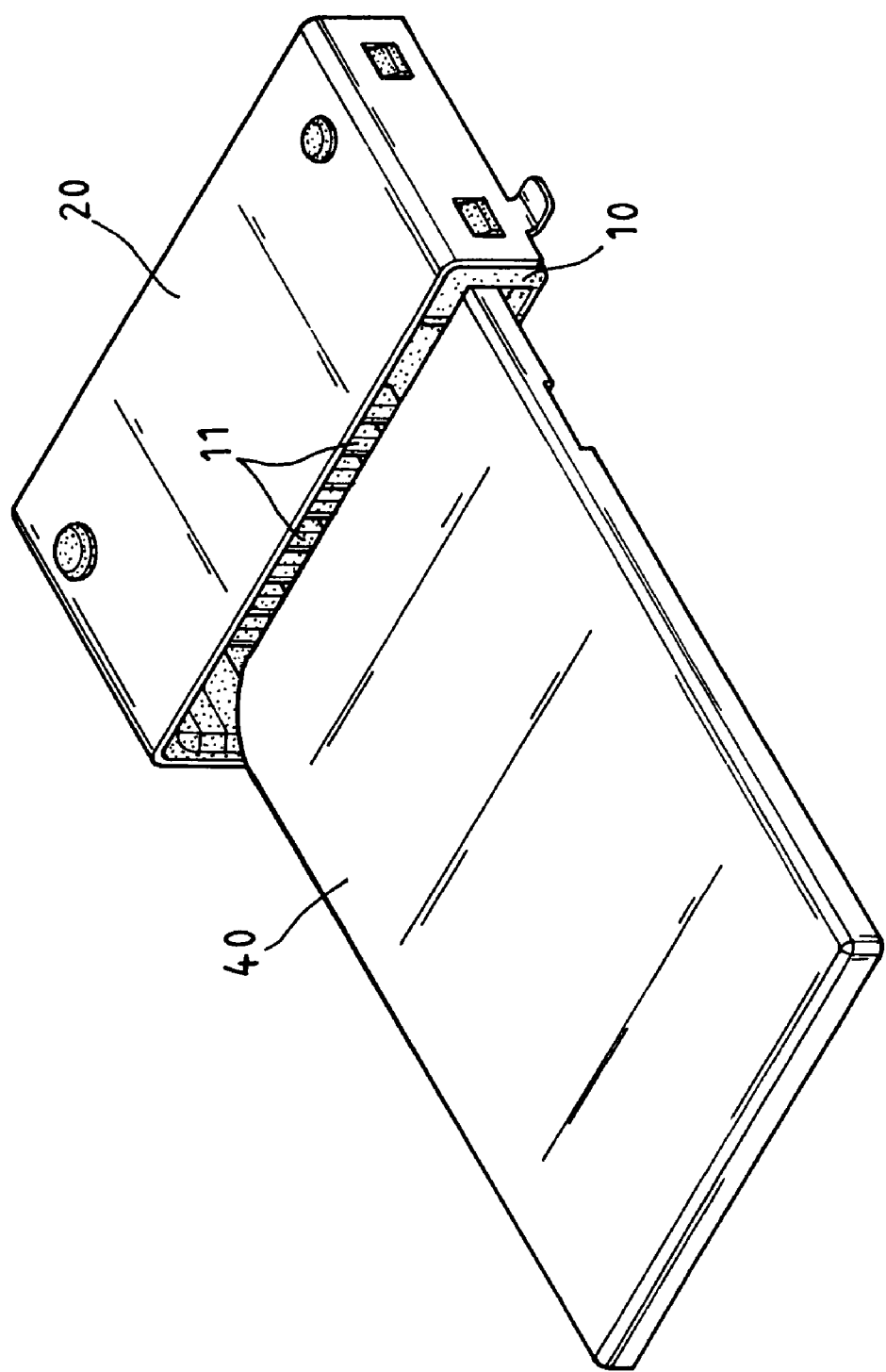
FIG. 3 is a perspective view of the memory card adapter of the invention, showing the prevention of the MS Duo card from a false insertion into the memory card adapter in a reverse direction.

Based on the above-mentioned configuration, the MS and MS Duo cards 30, 40 has a male connector recessed to form the conducting pieces 31, 41 at a front end thereof, respectively. The conducting pieces 31, 41 have different depth. Meanwhile, the conducting pieces 31, 41 have identical clearance to the other surface of MS and MS Duo cards 30, 40. In this way, the MS and MS Duo cards 30, 40 can be tightly engaged into the base 10 by means of the corresponding arrangement of the conducting pieces 31, 41 and the positioning fingers 11. Moreover, the positioning fingers 11 requires only very slight length without acting adverse influence on the electric connection between the internal contact (not shown) within the base 10 of the memory card adapter and the memory cards. In addition to the positioning function, the positioning fingers 11 prevent the MS and MS Duo cards 30, 40 from a false insertion into the memory card adapter in a reverse direction as shown in FIGS. 2 and 3. Accordingly, the MS and MS Duo cards 30, 40 can be tightly secured in place by use of the positioning fingers 11 of the base 10. Besides, the memory card adapter in accordance with the invention can be shared by the MS and MS Duo cards 30, 40.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claim.

What is claimed is:

1. A dual purpose memory card adapter, comprising a base and a cover, the base being configured as a female connector with a plurality of positioning fingers corresponding to conducting pieces of Memory Stick (MS) and MS Duo cards, the positioning fingers each extending along and protruding from a substantially planar inner surface of the cover to uniformly spaced within the memory card adapter for guiding the conducting pieces into engagement therewith.

2. A dual purpose memory card adapter Memory Stick (MS) and MS Duo cards, the dual purpose memory card adapter comprising:

a base and a cover coupled thereto;

the base having a female connector;

the cover having a substantially planar inner surface portion extending over the base;

a plurality of positioning fingers each extending along and protruding from the substantially planar inner surface portion of the cover to be uniformly spaced within the memory card adapter, the positioning fingers corresponding being disposed for guiding the MS and MS Duo card conducting pieces into engagement with the memory card adapter.

* * * * *